(12) United States Patent
Liang et al.

(10) Patent No.: US 8,594,970 B2
(45) Date of Patent: Nov. 26, 2013

(54) SYSTEM AND METHOD FOR TESTING OBJECTS USING A MECHANICAL ARM

(75) Inventors: Hsien-Chuan Liang, Taipei Hsien (TW); Shen-Chun Li, Taipei Hsien (TW); Shou-Kuo Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 589 days.

(21) Appl. No.: 12/824,221

(22) Filed: Jun. 27, 2010

(65) Prior Publication Data

US 2011/0196645 A1 Aug. 11, 2011

(30) Foreign Application Priority Data

Feb. 8, 2010 (TW) ................................ 99103735 A

(51) Int. Cl.
*G01C 9/00* (2006.01)
(52) U.S. Cl.
USPC ........................................................ 702/150

(58) Field of Classification Search
USPC ................................................... 702/150, 158
See application file for complete search history.

(56) References Cited

U.S. PATENT DOCUMENTS

| 6,282,528 | B1 * | 8/2001 | Schaffer et al. | 706/13 |
| 6,426,225 | B1 * | 7/2002 | Lewis et al. | 436/8 |
| 7,039,498 | B2 * | 5/2006 | Bacchi et al. | 700/245 |
| 7,535,411 | B2 * | 5/2009 | Falco | 342/174 |
| 7,917,327 | B2 * | 3/2011 | Co et al. | 702/121 |

* cited by examiner

*Primary Examiner* — Aditya Bhat
(74) *Attorney, Agent, or Firm* — Altis & Wispro Law Group, Inc.

(57) ABSTRACT

A system and method for testing objects using a mechanical arm sets one or more first positions. When a user selects one or more second positions of the mechanical arm, a distance between each of the second positions and each of the first positions is calculated. A nearest first position of each of the second positions is determined. Each of the second positions is stored in a test list corresponding to each of the nearest first positions. The mechanical arm is controlled to move to each of the nearest first positions, and tests objects located at the second positions stored in each test list corresponding to each of the nearest first positions.

9 Claims, 3 Drawing Sheets

SYSTEM AND METHOD FOR TESTING OBJECTS USING A MECHANICAL ARM

BACKGROUND

1. Technical Field

Embodiments of the present disclosure relate to testing system, and more particularly to a system and a method for testing objects using a mechanical arm.

2. Description of Related Art

When using a mechanical arm with objects, people need to set a first position and control movements of the mechanical arms according to the first position. The mechanical arm may test different objects repeatedly based on the first position. Because of working time of the mechanical arm is too long, various errors may occur in the mechanical arms movements.

What is needed, therefore, is an improved system and method for testing objects using a mechanical arm.

DETAILED DESCRIPTION

The processes described may be embodied in, and fully automated via, functional modules executed by one or more general purpose processors. The functional modules may be stored in any type of computer-readable medium or other computer storage device. Some or all of the methods may alternatively be embodied in specialized computer hardware or communication apparatus.

Figure 1:
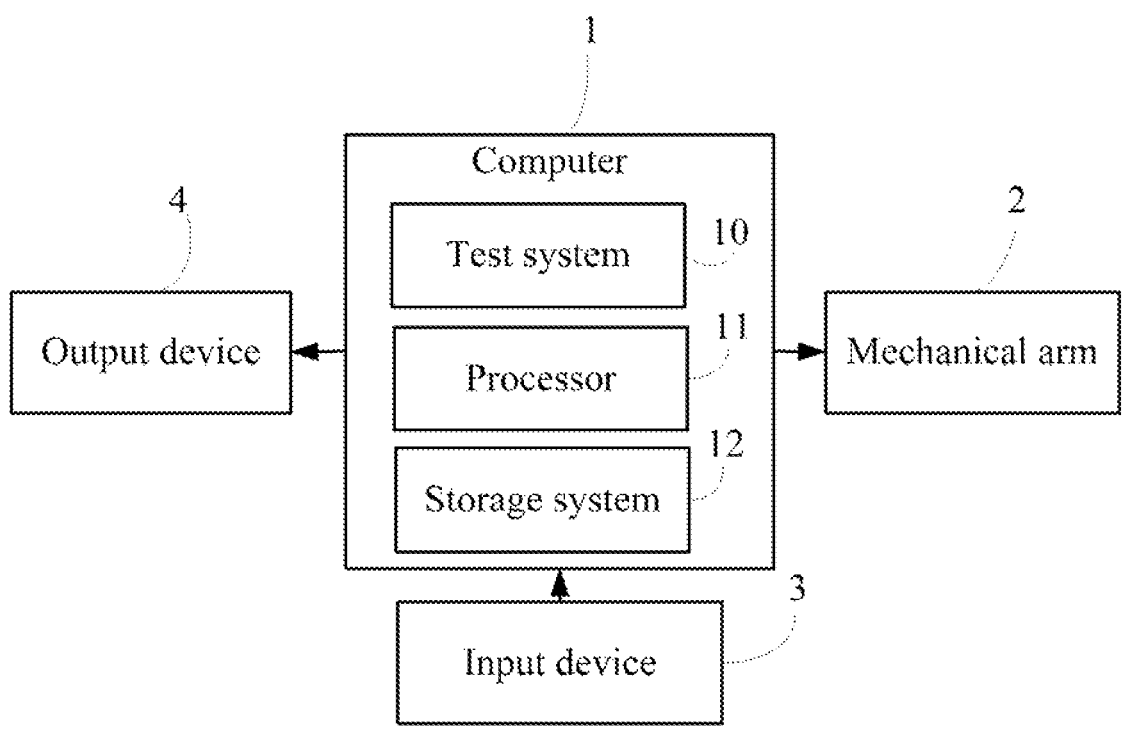
FIG. 1 is a block diagram of one embodiment of a computer comprising a test system.

FIG. 1 is a block diagram of one embodiment of a computer 1 including a test system 10. The test system 10 may be used to test objects using a mechanical arm 2 connected to the computer 1. In some embodiments, the mechanical arm 2 may test voltage of the objects, or size of the objects, for example. The object may be a component of a printed circuit board (PCB), for example, but the disclosure is not limited thereto. The computer 1 is electronically connected to an input device 3 and an output device 4. In one embodiment, the input device 3 may be a remote control system. The output device 4 may be a display. The input device 3 controls the mechanical arm 2 to move to a desired position set by a user. In some embodiments, the mechanical arm 2 works in a work area. For example, if the test system 10 tests a voltage of the component of the PCB, the PCB is defined as the work area of the mechanical arm 2.

The computer 1 includes a processor 11 and a storage system 12. It may be understood that one or more specialized or general purpose processors, such as the processor 11, may be used to execute one or more computerized codes of the function modules of the test system 10. The one or more computerized codes of the functional modules may be stored in the storage system 12. The storage system 12 also stores various data, such as test parameters, and test results, for example.

Figure 2:
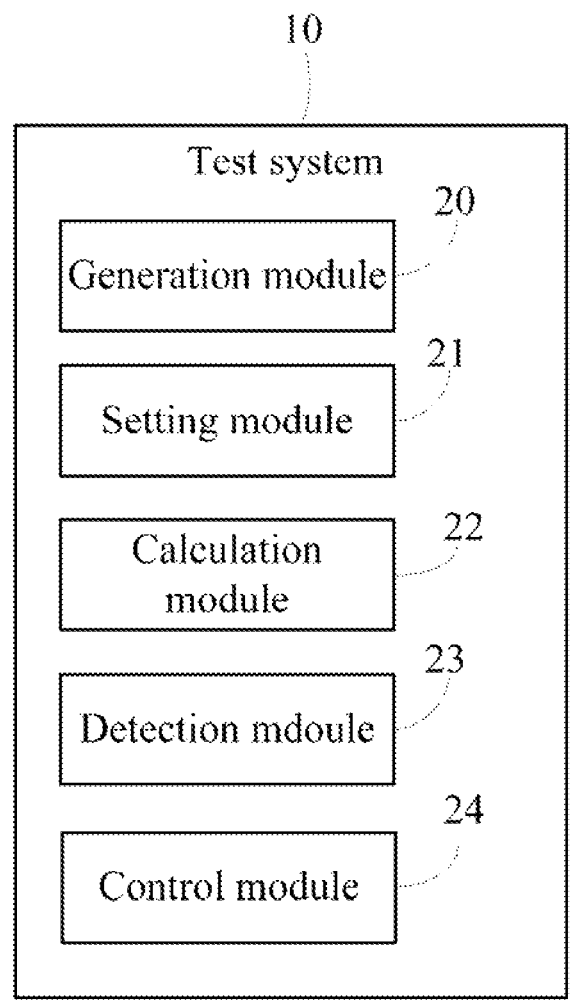
FIG. 2 is a block diagram showing functional modules of the test system of FIG. 1.

FIG. 2 is a block diagram of the test system 10 of FIG. 1. In one embodiment, the test system 10 may include a generation module 20, a setting module 21, a calculation module 22, a detection module 23, and a control module 24.

The generation module 20 generates a coordinate system based on the work area of the objects. The coordinate system may include an x-axis, a y-axis, and/or a z-axis, for example.

The setting module 21 sets one or more first positions to position the mechanical arm 2 according to the one or more first positions and records the coordinates of each of the first positions.

The calculation module 22 determines one or more second positions of the objects, and calculates a distance between each of the second positions and each of the first positions. In one embodiment, the calculation module 22 may receive coordinates input by the user from the input device 3, and determine the second positions according to the received coordinates. The calculation module 22 also determines a nearest first position of each of the second positions by comparing the calculated distances. For example, if the first positions include a position B and a position C, the calculation module 22 calculates a distance M between a second position A and the position B, and a distance N between the second position A and the position C. If the distance M is less than the distance N, the calculation module 22 determines that the nearest first position of the second position A is the position B.

The detection module 23 detects if the distance between each of the second positions and a corresponding nearest first position is not more than a maximum distance stored in the storage system 12. If the distance is more than the maximum distance, the detection module 23 prompts the user to reset the maximum distance, and updates the maximum distance stored in the storage system 12. If the distance is not more than the maximum distance, the setting module 21 stores coordinates of each of the second positions to a test list corresponding to each nearest first positions. For example, if the distance M is not more than the maximum distance, the setting module 21 stores the coordinates of the second position A to the test list corresponding to the position B.

The setting module 21 also lists the coordinates of the second positions in each test list in sequence. In one embodiment, the coordinates of the second positions in each test list are listed according to the distance between each of the second positions and the corresponding nearest first position. The calculation module 22 calculates a distance between each two of the second positions in each test list. The calculation module 22 also determines a subsequent second position according to the distance between the subsequent position and a current second position, which an object located at is tested by the mechanical arm 2.

The control module 24 controls the mechanical arm 2 to move to each of the nearest first positions, and tests each of the objects located at each of the second positions whose coordinates are stored in the test list of the nearest first position corresponding to the second position. For example, the test list corresponding to the first position C stores coordinates of the second position A and a second position D. If the distance between the second position A and the first position C is less than the distance between the second position D and the first position C. An object located at the second position A is tested first, and then the second position D is searched according to the distance between the second position A and the second position D. The control module 24 controls the mechanical arm 2 to test the object located at the second position D.

Figure 3:
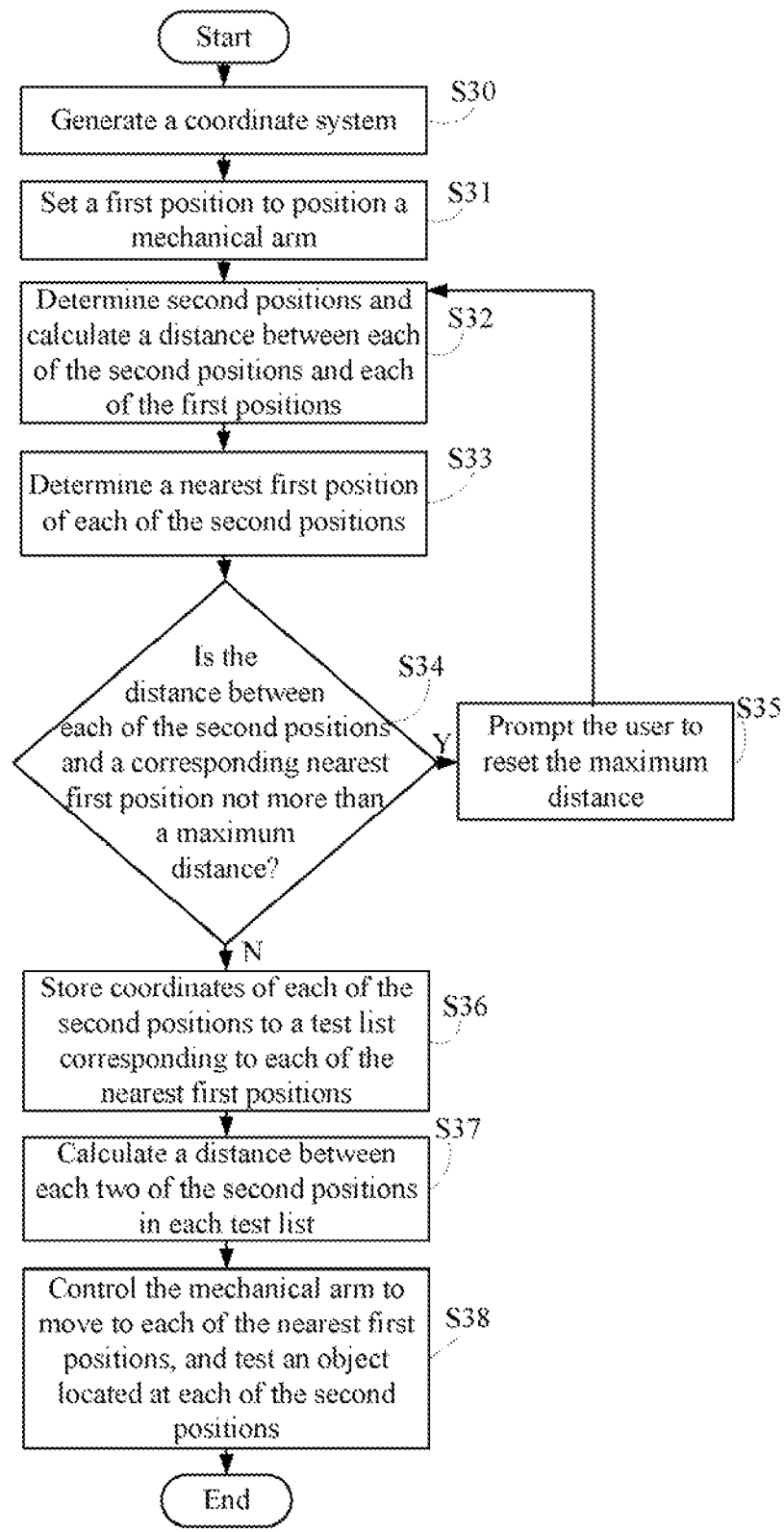
FIG. 3 is a flowchart of one embodiment of a method for testing objects using a mechanical arm.

FIG. 3 is a flowchart of one embodiment of a method for testing objects using the mechanical arm 2. Depending on the embodiment, additional blocks may be added, others removed, and the ordering of the blocks may be changed.

In block S30, the generation module 20 generates a coordinate system based on the work area of the objects.

In block S31, the setting module 21 sets one or more first positions to position the mechanical arm 2 according to the one or more first positions and records the coordinates of each of the first positions.

In block S32, the calculation module 22 determines one or more second positions of the objects, and calculates a distance between each of the second positions and each of the first positions.

In block S33, the calculation module 22 determines a nearest first position of each of the second positions according to the calculated distances.

In block S34, the detection module 23 detects to see if the distance between each of the second positions and a corresponding nearest first position is not more than a maximum distance stored in the storage system 12. If the distance is more than the maximum distance, in block S35, the detection module 23 prompts the user to reset the maximum distance and updates the maximum distance stored in the storage system 26 using the reset maximum distance. If the distance is not more than the maximum distance, block S36 is implemented.

In block S36, the setting module 21 stores coordinates of each of the second positions to a test list corresponding to each nearest first position, and lists the coordinates of the second positions in each test list in sequence.

In block S37, the calculation module 22 calculates a distance between each two of the second positions in each test list.

In block S38, the control module 24 controls the mechanical arm 2 to move to each of the nearest first positions, and tests each of the objects located at each of the second positions whose coordinates are stored in the test list of the nearest first position corresponding to the second position.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computing system, comprising:
   a storage system; and
   at least one processor to execute one or more programs stored in the storage system, the one or more programs comprising:
   a setting module operable to set one or more first positions to position a mechanical arm according to the one or more first positions;
   a calculation module operable to determine one or more second positions of objects, calculate a distance between each of the second positions and each of the first positions, and determine one or more first positions according to the calculated distances, wherein each of the determined first positions is nearest to one of the second positions and corresponds to a test list;
   the setting module further operable to store coordinates of each of the second positions to the test list; and
   a control module further operable to control the mechanical arm to move to each of the determined first positions, and test each of the objects located at each of the second positions whose coordinates are stored in the test lists.

2. The system of claim 1, wherein the one or more programs further comprise a detection module operable to detect if the distance between each of the second positions and the corresponding determined first position is not more than a predetermined maximum distance, and prompt a user to reset the maximum distance if the distance is more than the predetermined maximum distance.

3. The system of claim 1, wherein:
   the calculation module is further operable to calculate a distance between each two of the second positions in the test list corresponding to each of the determined first positions; and
   the control module is further operable to determine a relative position of a subsequent second position according to the distance between a current second position and the subsequent second position after the mechanical arm tests the object located at the current second position.

4. A computer-implemented method for testing objects using a mechanical arm, the method comprising:
   (a) setting one or more first positions to position the mechanical arm according to the one or more first positions;
   (b) determining one or more second positions of the objects;
   (c) calculating a distance between each of the second positions and each of the first positions;
   (d) determining one or more first positions according to the calculated distances, wherein each of the determined first positions is nearest to one of the second positions and corresponds to a test list;
   (e) storing coordinates of each of the second positions to the test list; and
   (f) controlling the mechanical arm to move to each of the determined first positions, and testing each of the objects located at each of the second positions whose coordinates are stored in the test lists.

5. The method of claim 4, after block (d) comprising:
   detecting if the distance between each of the second positions and the corresponding determined first position is not more than a predetermined maximum distance; and
   prompting a user to reset the maximum distance if the distance is more than the predetermined maximum distance; or
   implementing block (e) if the distance is not more than the maximum distance.

6. The method of claim 4, block (f) further comprising:
   (a1) calculating a distance between each two of the second positions in the test list corresponding to each of the determined first positions;
   (b1) testing the object located at a second position;
   (c1) determining a relative position of a subsequent second position according to the distance between the second position and the subsequent second position, and testing the object located at the subsequent second position; and
   (d1) repeating block (c1) till the object located at each second position has been tested.

7. A non-transitory computer-readable medium having stored thereon instructions that, when executed by a processor of a computer, causes the computer to perform a method for testing objects using a mechanical arm, the method comprising:
   (a) setting one or more first positions to position the mechanical arm according to the one or more first positions;
   (b) determining one or more second positions of the objects;
   (c) calculating a distance between each of the second positions and each of the first positions;
   (d) determining one or more first positions according to the calculated distances, wherein each of the determined first positions is nearest to one of the second positions and corresponds to a test list;

(e) storing coordinates of each of the second positions to the test list; and (f) controlling the mechanical arm to move to each of the determined first positions, and testing each of the objects located at each of the second positions whose coordinates are stored in the test lists.

8. The non-transitory computer-readable medium of claim 7, after block (d) comprising:

detecting if the distance between each of the second positions and the corresponding determined first position is not more than a predetermined maximum distance; and prompting a user to reset the maximum distance if the distance is more than the predetermined maximum distance; or implementing block (e) if the distance is not more than the maximum distance.

9. The non-transitory computer-readable medium of claim 7, block (f) further comprising:

(a1) calculating a distance between each two of the second positions in the test list corresponding to each of the determined first positions;

(b1) testing the object located at a second position;

(c1) determining a relative position of a subsequent second position according to the distance between the second position and the subsequent second position, and testing the object located at the subsequent second position; and (d1) repeating block (c1) till the object located at each second position has been tested.

* * * * *